United States Patent
Peters

(10) Patent No.: US 6,200,504 B1
(45) Date of Patent: Mar. 13, 2001

(54) METHOD FOR ENCAPSULATING WITH PLASTIC A LEAD FRAME WITH CHIPS

(75) Inventor: Hendrikus Johannes Bernardus Peters, Didam (NL)

(73) Assignee: Fico B.V. (NL)

( * ) Notice: Subject to any disclaimer, the term of this patent is extended or adjusted under 35 U.S.C. 154(b) by 0 days.

(21) Appl. No.: 08/871,899

(22) Filed: Jun. 9, 1997

Related U.S. Application Data

(62) Division of application No. 08/571,884, filed on Jan. 11, 1996, now abandoned.

(30) Foreign Application Priority Data

May 9, 1994 (NL) .................................................. 9400768

(51) Int. Cl.[7] ............................ B29C 45/02; B29C 70/70
(52) U.S. Cl. ................ 264/39; 264/272.14; 264/272.17; 264/328.4
(58) Field of Search ................................ 264/39, 272.11, 264/272.14, 272.15, 272.17, 328.4, 328.5; 425/116, 120, 543, 544, 129.1

(56) References Cited

U.S. PATENT DOCUMENTS

| | | | |
|---|---|---|---|
| 2,410,510 | * 11/1946 | Lester | 264/328.4 |
| 3,071,814 | 1/1963 | Guggenheim | 18/42 |
| 3,898,314 | * 8/1975 | Church | 264/294 |
| 4,909,724 | * 3/1990 | Sonoda et al. | 425/544 |
| 5,123,826 | 6/1992 | Baird | 425/129 |
| 5,123,833 | * 6/1992 | Parker | 425/577 |
| 5,139,728 | * 8/1992 | Baird | 264/272.17 |
| 5,451,154 | 9/1995 | Schaars | 425/129.1 |
| 5,460,502 | 10/1995 | Majercak | 425/116 |

FOREIGN PATENT DOCUMENTS

| | | | |
|---|---|---|---|
| 53-35760 | 4/1978 | (JP) | 425/544 |
| 62-184821 | 8/1987 | (JP) | 425/544 |
| 63-41035 | 2/1988 | (JP) . | |
| 6-21121 | 1/1994 | (JP) | 264/272.17 |
| WO 93/11925 | 6/1993 | (WO) . | |

* cited by examiner

Primary Examiner—Angela Ortiz
(74) Attorney, Agent, or Firm—Limbach & Limbach L.L.P.

(57) ABSTRACT

An apparatus for encapsulating with plastic lead frames carrying chips includes mutually movable halves. In the closed position the movable halves bound a mold cavity for receiving a lead frame, a feed runner connecting onto the mold cavity for supplying encapsulating material, a pot for receiving an encapsulating material and a plunger reciprocating in the pot, connected onto said feed runner for carrying up encapsulating material under pressure. At a distance from a head end of the plunger a peripheral groove is arranged which is connected to the head end by at least one flow channel. The outer wall of the plunger is provided with helically running grooves and the depth of the grooves increases as seen from the drive side of the plunger.

4 Claims, 4 Drawing Sheets

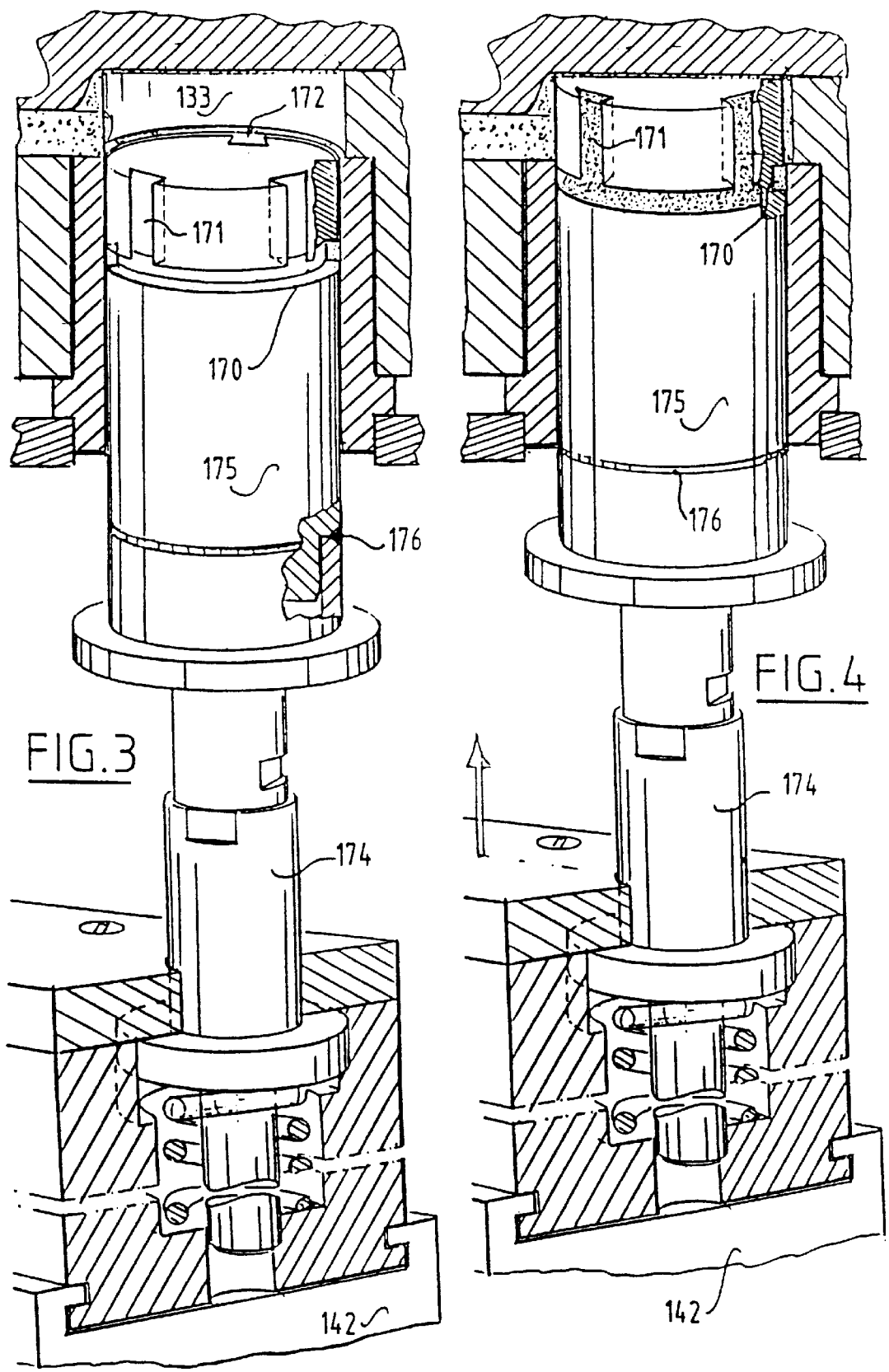

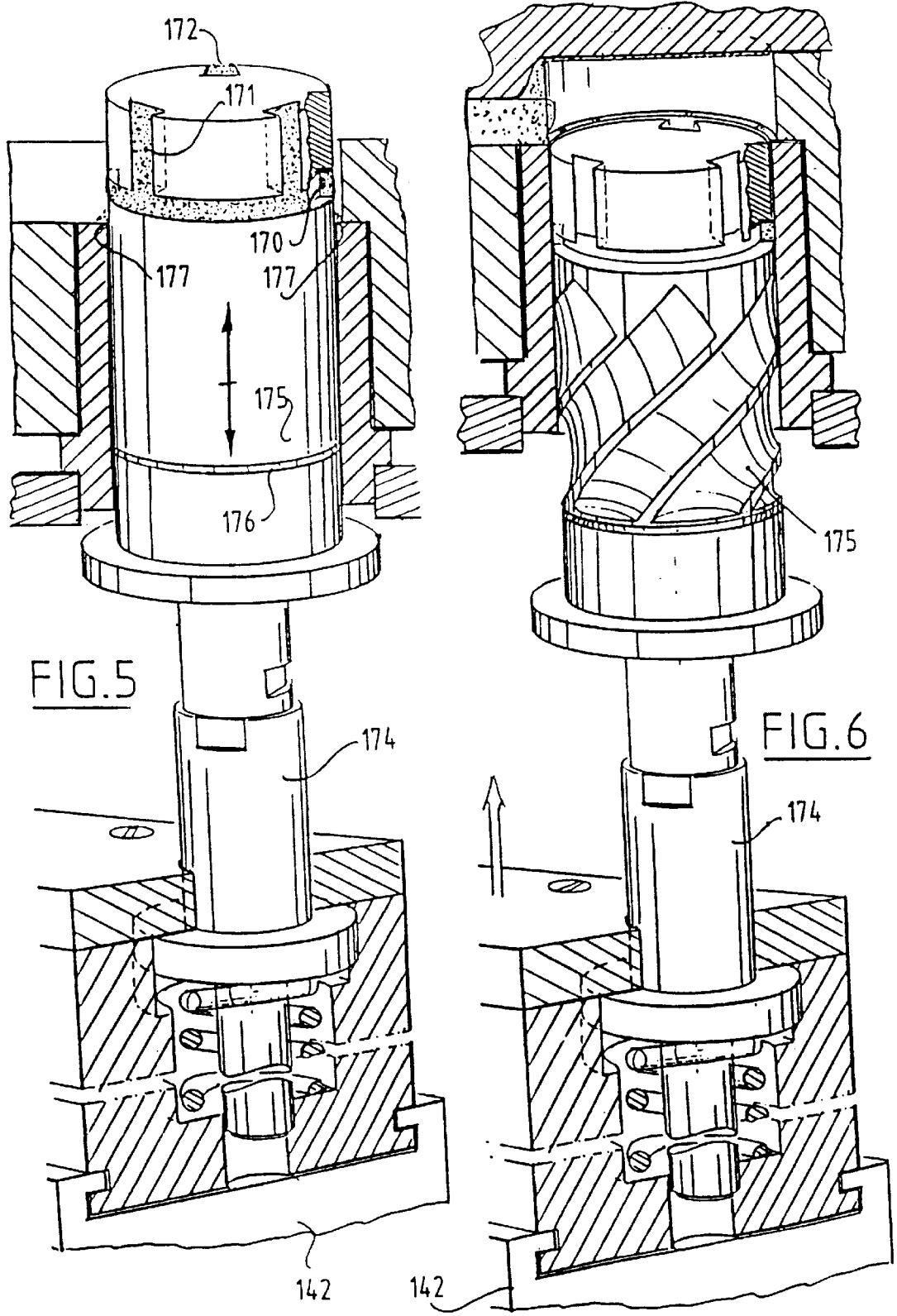

METHOD FOR ENCAPSULATING WITH PLASTIC A LEAD FRAME WITH CHIPS

This is a divisional application Ser. No. 08/571,884, filed Jan. 11, 1996, now abandoned.

BACKGROUND OF THE INVENTION

The invention relates to an apparatus for encapsulating with plastic lead frame that carries at least one chip, comprising mutually movable mould halves which in the closed position bound a mould cavity for receiving a lead frame, a feed runner connecting onto the mould cavity for supplying encapsulating material and a plunger-cylinder connected onto this feed runner for carrying up encapsulating material under pressure. Such an apparatus is known from the European patent application 89.203003.2.

The problem with apparatus of this type is that despite a close fitting of the plunger in the cylinder there is the danger of liquid encapsulating material running along the wall of the plunger. The cylinder wall is hereby fouled, which results in interruptions in the encapsulating process.

SUMMARY OF THE INVENTION

The invention has the object of providing a solution to this problem. This is achieved according to the invention in that at a distance from the head end of the plunger a peripheral groove is arranged which is connected to the head end by means of at least one flow channel.

With the steps according to the invention the following is achieved. When a production stroke is performed and a pellet-shaped piece of encapsulating material is placed on the plunger head, which material becomes fluid through exerting of pressure and under the influence of heat, the encapsulating material will reach and fill the peripheral groove through the flow channels. The filled groove then serves as sealant of the plunger relative to the inner wall of the cylinder. At the end of the production stroke the plunger moves outside the upper edge of the cylinder. During the return movement the outer layer of the groove will be scraped off by the scraping edge of the cylinder. During a subsequent production stroke encapsulating material will be able to move through the clearance between the plunger and the inner wall of the cylinder and once again replenish the scraped-off outer layer of the encapsulating material in the groove.

A self-regulating sealing system is thus obtained.

The flow channel is preferably of swallowtail shape in order to ensure securing of the cured quantity of encapsulating material into the groove.

Further advantages and special features will become apparent from the description following hereinbelow of the drawings, in which:

BRIEF DESCRIPTION OF THE DRAWINGS

FIG. 5 shows a view of the head end of the plunger according to the invention, and FIG. 6 is a cross sectional view of an alternative embodiment of the invention.

DESCRIPTION OF THE PREFERRED EMBODIMENT

Figure 1:
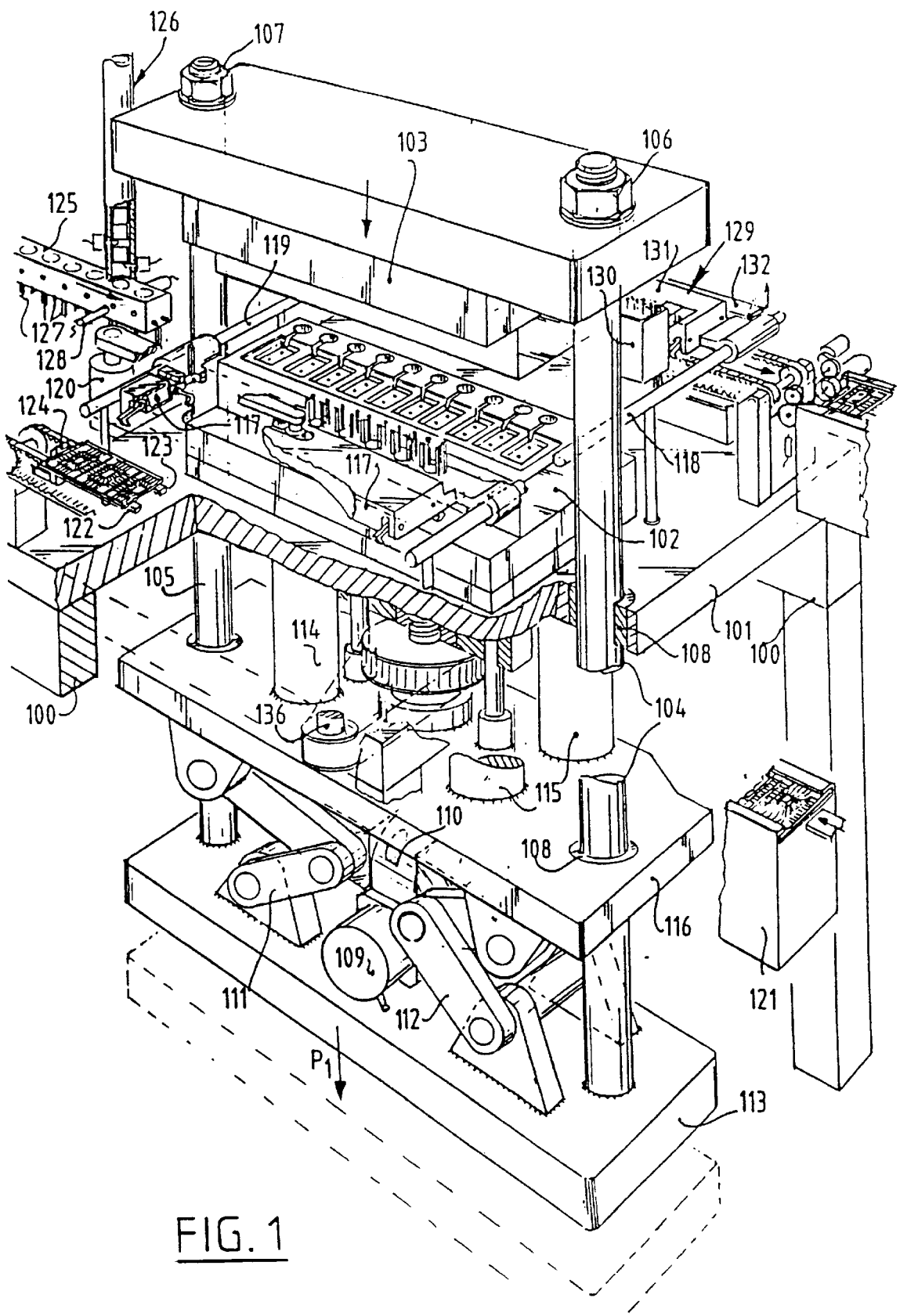
FIG. 1 shows a perspective view with broken away parts of the apparatus according to the invention.

A description of the moulding apparatus according to the invention will be given with reference to FIGS. 1 and 2.

Mounted on the frame 100 of the machine is a fixedly positioned table 101. The table 101 bears a fixed lower mould half 102. The upper mould half 103 is movable relative to the lower half 102 using pull rods 104, 105 which are connected to the upper half 103 by the respective nut connections, 106, 107. The pull rods 104, 105 are movable relative to the fixed table 101 via bearings, for example 108.

The driving of the upper half of the mould 103 takes place from an electric motor 109. The angle lever systems 111, 112 are driven by means of the worm box 110. The angle lever systems are coupled on the one side to a movable underplate 113 and on the other side to a plate 116 fixedly connected to the table 101 by means of columns 114, 115. When the electric motor rotates the underplate 113 is moved vertically, for example in the direction of the arrow P1, which movement is transmitted via the pull rods 104, 105 onto the upper mould half 103. At the end of the stroke the arms of the angle lever system 111, 112 lie pratically in one line so that a very great closing force is achieved.

The input carriage 117 is movable over the guide rails 118, 119. The driving of the input carriage 117 takes place from the electric motor 120.

Lead frames are supplied from a supply cassette and are carried up over belts 122, 123 as far as a stop 124. During the position of the input carriage outside the mould the input carriage is filled from a so-called pellet-filling carriage 125 with pellet-shaped encapsulating material which is taken from a supply reservoir 126. For a reliable take-over of pellet-shaped encapsulating material by the input carriage 117 from the pellet transporting carriage 125 use is made in both carriages of pin-shaped guiding means 127. The mutual movements are controlled using a sensor 128.

The cleaning-discharge unit 129 is likewise movable over the rails 118, 119 between the position outside the mould die and the position inside the mould die. The unit 129 consists of a cleaning-brushing apparatus 130 and a discharge member 131. The cleaning apparatus 130 brushes both mould halves after use and simultaneously sucks up brushed-off remnants. Co-acting with the unit is a break-off plate 132 which subjects the finished product to an after-processing.

Figure 2:
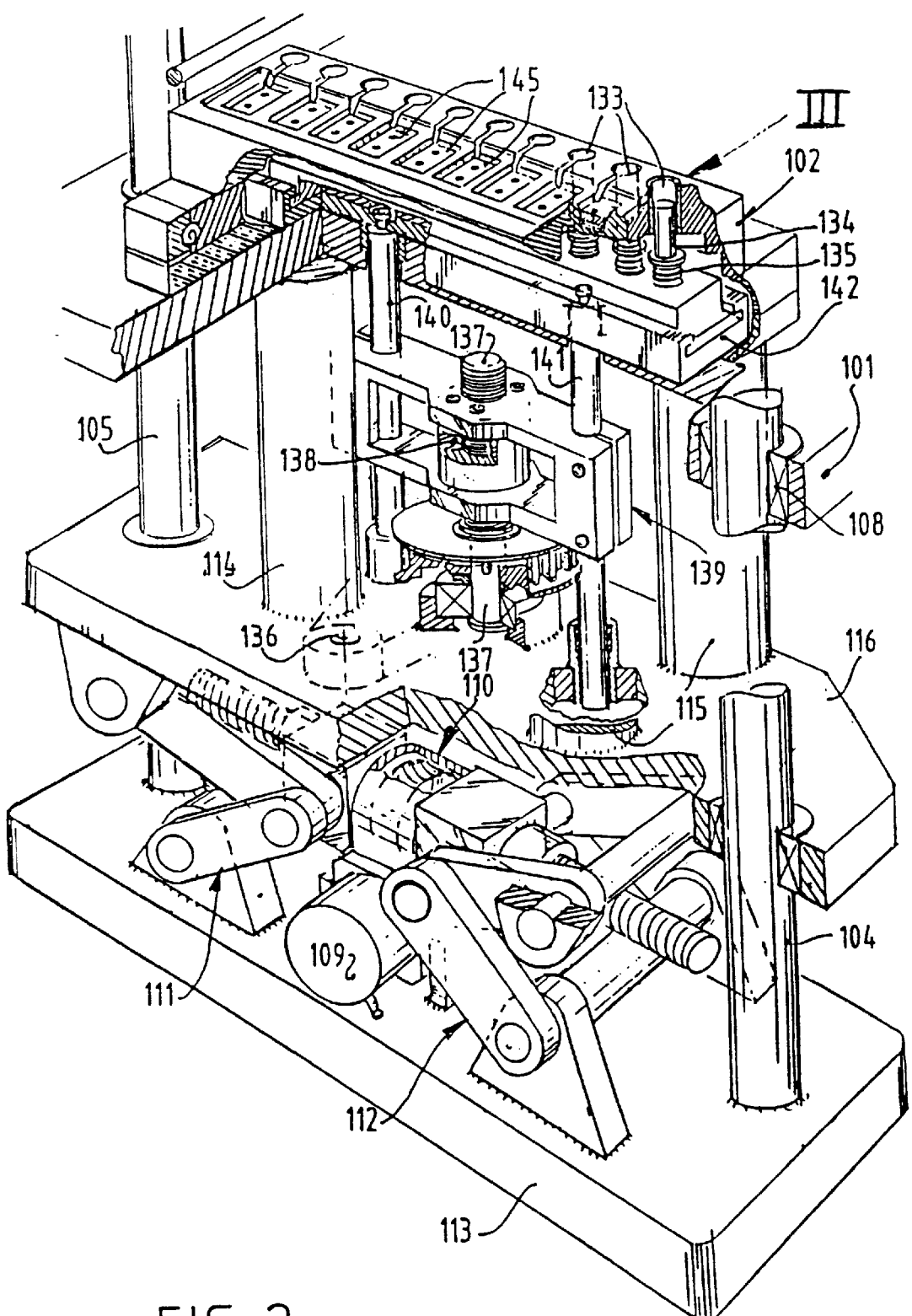
FIG. 2 shows on large scale a detail of the lowermost part of the apparatus of FIG. 1, FIGS. 3 and 4 are cross sectional views of the plunger and the plunger driving drive rod.

As can be seen in FIG. 2, the cavities 133 in the lower half 102 of the mould are each provided with a plunger 134 which is biased by a spring 135 such that the position of the plunger is adapted to the quantity of encapsulating material in the relevant cavities 133. The plungers are driven from an electric motor which drives a screwed rod 137 via the speed control 136. A nut 138 is placed on the screwed rod so that the rotating movement is converted into a vertically directed movement of the frame 139. Fixedly coupled to the frame are the drive rods 140, 141 for the plunger bracket 142 which in turn drives the plungers.

Pellet-shaped encapsulating material is compressed during the ascending movement of the plunger 175 and transported via a runner to the cavity 145 in the lower half of the mould where the chip is arranged.

According to the invention the plunger 175 is provided at a relatively short distance from the head end with a groove 170 which is connected to the head end by means of flow channels, for instance 171, 172. The flow channels 171, 172 preferably take a swallowtail form, thus preventing breaking away and fouling due to the breaking away of the encapsulating material. According to an alternative embodiment the plunger 175 is provided with helical grooves, the depth of which increases from the head end of the plunger to opposing rear end of the plunger.

The drive rod 174 of plunger 175 is connected to plunger 175 by means of welds 176.

The apparatus according to the invention operates as follows. When a production stroke is performed a pellet-shaped piece of encapsulating material is placed on the head end of the plunger 175. When the stroke is performed the encapsulating material becomes plastic and moves through the flow channels 171, 172 to the groove 170 in the plunger 175. The groove 170 is wholly filled. When the product is ejected the groove 170 of plunger 175 rises above the cylinder such that during the return stroke the material in the groove 170 is scraped off on the sharp cylinder edge. After performing of the production stroke a number of cleaning strokes can be carried out as desired, wherein the plunger 175 rises each time above the cylinder wall and a scraping action is therefore performed on the material in the groove 170 of plunger 175. In practice the number of non-operational strokes is chosen between one and six. During a subsequent production stroke the encapsulating material will be able to flow downward along the plunger wall as far as the groove 170 due to the clearance between cylinder wall and plunger 175 and thereby once again replenish the scraped-off, cured layer in the groove 170. The replenished layer in groove 170 thus forms a sealant between the plunger 175 and the inner wall of the cylinder.

What is claimed is:

1. A method for encapsulating with plastic lead frames carrying chips comprising the steps of:

providing a lead frame that carries at least one chips within a mold cavity;

applying an encapsulating material on a head end of a plunger;

exerting pressure and supplying heat such that the encapsulating material becomes fluid;

flowing the encapsulating material through at least one flow channel and into a peripheral groove in the plunger;

filling the groove with the encapsulating material to seal the plunger against an inner wall of a cylinder;

supplying the encapsulating material to the mold cavity and encapsulating the lead frame carrying chips;

moving the plunger outside an upper edge of the cylinder, wherein during a return of the plunder into the cylinder a scraping edge of the cylinder scrapes off an outer layer of the encapsulating material in the groove and creates a clearance between the plunger and inner wall of the cylinder; and applying additional encapsulating material on the head end of a plunger, wherein the additional encapsulating material moves through the clearance between the plunger and an inner wall of the cylinder replenishing the scraped off outer layer of the encapsulating material in the groove.

2. A method for encapsulating with plastic lead frames carrying chips comprising the steps of:

providing a lead frame that carries at least one chips within a mold cavity;

applying a first production stroke having a first performance stroke and a return stroke, wherein during the performance stroke an encapsulating material is applied on a head end of a plunger, pressure and heat are applied to the plunger forcing the encapsulating material into a cylinder such that the material becomes fluid, the encapsulating material moves through flow channels to a peripheral groove in the plunger, the groove fills with the encapsulating material to seal the plunger against an inner wall of the cylinder, encapsulating material is supplied to the mold cavity and encapsulates the lead frame carrying chips, and the plunger rises above an upper edge of the cylinder, and wherein during the return stroke of the plunger to the cylinder, a scraping edge of the cylinder scrapes off an outer layer of the encapsulating material in the groove; and applying a second production stroke having a second performance stroke, wherein additional encapsulating material flows along the plunger wall as far as the groove due to the clearance between the plunger and the inner wall of the cylinder, thereby replenishing the scraped-off outer layer of the encapsulating material in the groove.

3. The method of claim 2, further including the step of applying at least one cleaning stroke, wherein the plunger is raised above the cylinder, causing a scraping edge of the cylinder to scrape off the encapsulating material in the groove.

4. The method of claim 3, wherein between one and six cleaning strokes are applied.

* * * * *

UNITED STATES PATENT AND TRADEMARK OFFICE
CERTIFICATE OF CORRECTION

PATENT NO. : 6,200,504 B1
DATED : March 13, 2001
INVENTOR(S) : Hendrikus Johannes Bernardus Peters It is certified that error appears in the above-identified patent and that said Letters Patent is hereby corrected as shown below:

Column 3, claim 1,
Line 33, "at least one chips" should read -- at least one chip --.

Column 4, claim 2,
Line 14, "at least one chips" should read -- at least one chip --.

Signed and Sealed this

Thirtieth Day of October, 2001

Attest:

*Attesting Officer*

NICHOLAS P. GODICI
*Acting Director of the United States Patent and Trademark Office*